United States Patent
Tsai et al.

(10) Patent No.: US 10,523,205 B1
(45) Date of Patent: Dec. 31, 2019

(54) BUFFERING DEVICE AND METHOD OF CONTROLLING BUFFERING DEVICE

(71) Applicant: TAIWAN SEMICONDUCTOR MANUFACTURING COMPANY LTD., Hsinchu (TW)

(72) Inventors: Yu-Kai Tsai, Hsinchu (TW); Chia-Jung Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/276,423

(22) Filed: Feb. 14, 2019

Related U.S. Application Data

(60) Provisional application No. 62/748,139, filed on Oct. 19, 2018.

(51) Int. Cl.
| | |
|---|---|
| H03K 19/0185 | (2006.01) |
| H03K 19/0944 | (2006.01) |
| G01R 19/165 | (2006.01) |
| H03K 19/003 | (2006.01) |
| H03K 19/173 | (2006.01) |

(52) U.S. Cl.
CPC ........ *H03K 19/018521* (2013.01); *G01R 19/16528* (2013.01); *H03K 19/00315* (2013.01); *H03K 19/0944* (2013.01); *H03K 19/173* (2013.01); *G01R 19/16519* (2013.01)

(58) Field of Classification Search
CPC ......... H03K 19/018521; H03K 19/173; H03K 19/00315; H03K 19/0944; G01R 19/16528; G01R 19/16519
USPC .......................................................... 326/38
See application file for complete search history.

(56) References Cited

U.S. PATENT DOCUMENTS

| | | | | |
|---|---|---|---|---|
| 6,188,246 B1 * | 2/2001 | Ogawa | ............... | H03K 19/0016 326/34 |
| 9,030,248 B2 * | 5/2015 | Kim | .................. | H03K 19/0185 326/62 |
| 2007/0247186 A1 * | 10/2007 | Sakata | .................. | G11C 5/147 326/34 |
| 2008/0218211 A1 * | 9/2008 | Barasinski | ....... | H03K 19/01707 326/62 |

* cited by examiner

*Primary Examiner* — Don P Le
(74) *Attorney, Agent, or Firm* — WPAT, P.C., Intellectual Property Attorneys; Anthony King

(57) ABSTRACT

A buffering device includes: a buffering circuit coupled between a first voltage source providing a first voltage level and a second voltage source providing a second voltage level, for selectively outputting an output signal with the first voltage level or the second voltage level according to an input signal; and a controlling circuit coupled to the buffering circuit, for generating a first control signal to disconnect the buffering circuit from the first voltage source and generating a second control signal to connect the buffering circuit to the second voltage source when the buffering circuit transits the output signal from the first voltage level to the second voltage level. The second voltage level is different from the first voltage level.

20 Claims, 14 Drawing Sheets

BUFFERING DEVICE AND METHOD OF CONTROLLING BUFFERING DEVICE

PRIORITY CLAIM AND CROSS-REFERENCE

This application claims the benefit of U.S. Provisional Application No. 62/748,139, filed on Oct. 19, 2018, the disclosure of which is hereby incorporated by reference in its entirety.

BACKGROUND

Inverters are frequently used as a buffer of a signal. However, the available voltage headroom of a buffer may not be sufficient in modern electronic systems which operate with low supply voltage. For a buffer with low voltage headroom, the noise, which is generated from internal circuits or injected from external circuits, at the input of the buffer may directly introduce jitter or glitches at the output, and lead to system malfunction. The noise generated from internal circuits or injected from external circuits may not be scaled in accordance with the voltage headroom. Therefore, a buffer operated with low supply voltage and with suppressed jitter and glitches is highly desirable in modern electronic systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
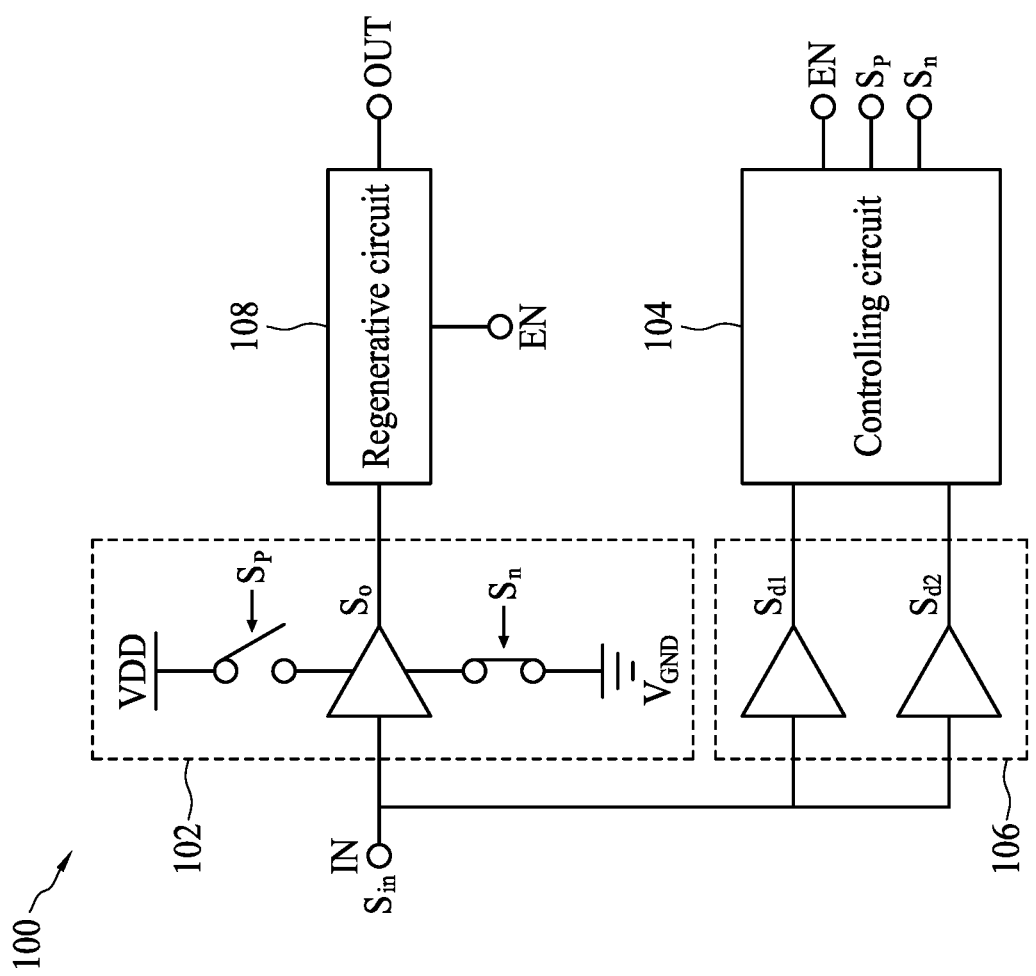
FIG. 1 is a diagram illustrating a buffering device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram illustrating a buffering device 100 in accordance with some embodiments. The buffering device 100 comprises a buffering circuit 102, a controlling circuit 104, a detecting circuit 106, and a regenerative circuit 108. The buffering circuit 102 is coupled between a supply voltage source (not shown) providing a supply voltage level $V_{DD}$ and a ground voltage source (not shown) providing a ground voltage level $V_{GND}$ for selectively outputting an output signal $S_o$ with the supply voltage level $V_{DD}$ or the ground voltage level $V_{GND}$ according to an input signal $S_{in}$.

According to some embodiments, the buffering circuit 102 may be a voltage buffer. When the voltage level of the input signal $S_{in}$ is greater than the middle voltage level $V_M$, the buffering circuit 102 outputs the supply voltage level $V_{DD}$, and when the voltage level of the input signal $S_{in}$ is smaller than the middle voltage level $V_M$, the buffering circuit 102 outputs the ground voltage level $V_{GND}$. The middle voltage level $V_M$ of the input signal $S_{in}$ may be the average voltage level of the supply voltage level $V_{DD}$ and the ground voltage level $V_{GND}$.

Figure 2:
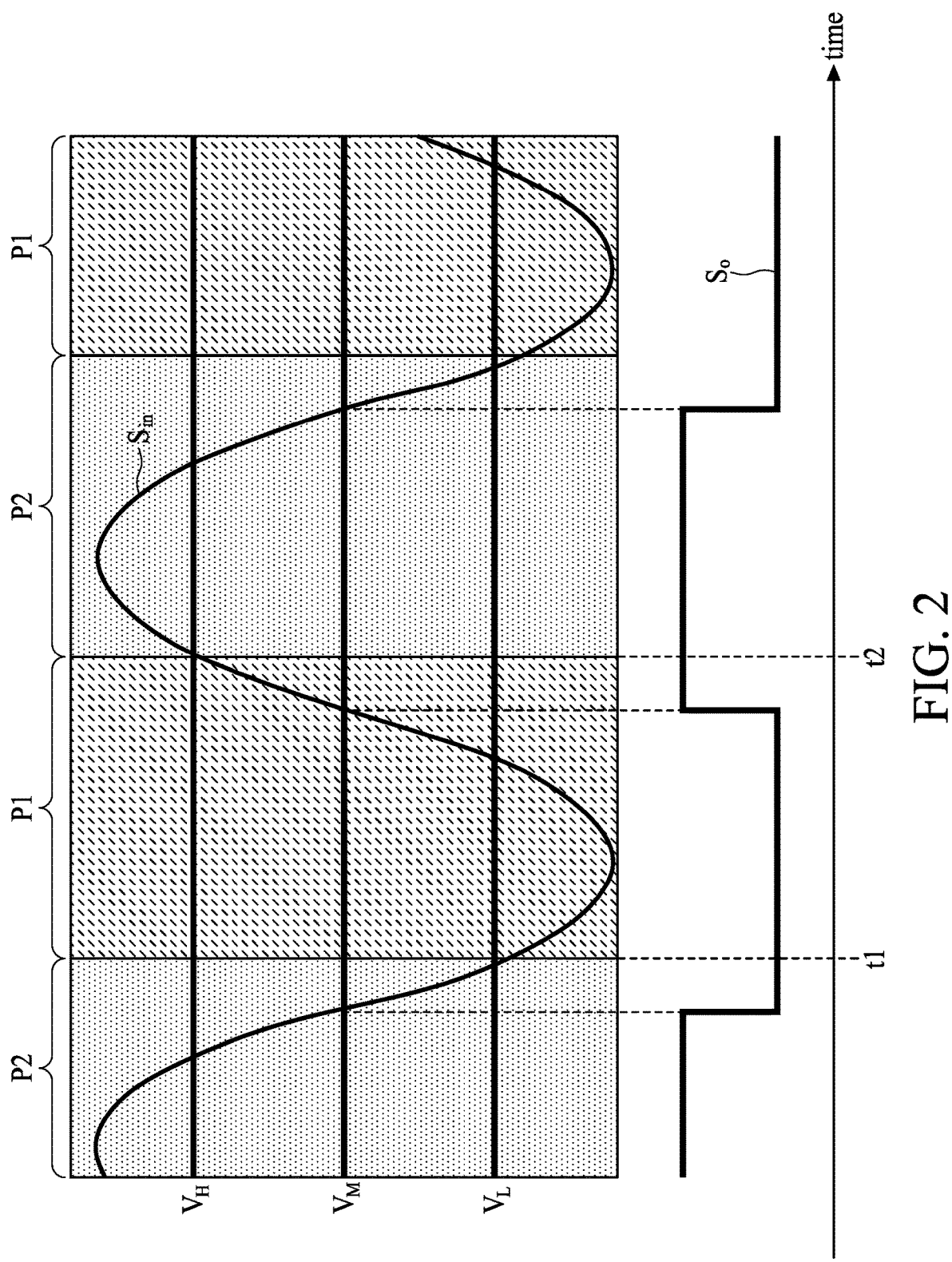
FIG. 2 is a timing diagram illustrating an input signal and an output signal of a buffering circuit in accordance with some embodiments.

For brevity, the operation of the buffering device 100 is described by implementing the buffering circuit 102 as a voltage buffer. FIG. 2 is a timing diagram illustrating the input signal $S_{in}$, and the output signal $S_o$ of the buffering circuit 102 in accordance with some embodiments. According to some embodiments, when the buffering circuit 102 transits the voltage level of the output signal $S_o$ from the ground voltage level $V_{GND}$ to the supply voltage level $V_{DD}$, the region of the input signal $S_{in}$, is defined as the first phase P1 (i.e. region 0). When the buffering circuit 102 transits the voltage level of the output signal $S_o$ from the supply voltage level $V_{DD}$ to the ground voltage level $V_{GND}$, the region of the input signal $S_{in}$, is defined as the second phase P2 (i.e. region 1). Briefly, during the first phase P1, the voltage level of the input signal $S_{in}$, gradually increases from the minimum voltage level to pass the middle voltage level $V_M$. During the second phase P2, the voltage level of the input signal $S_{in}$, gradually decreases from the maximum voltage level to pass the middle voltage level $V_M$. When the voltage level of the input signal $S_{in}$, gradually decreases to reach a relatively low voltage level $V_L$ of the input signal $S_{in}$, at time t1, the buffering circuit 100 enters the first phase P1. When the voltage level of the input signal $S_{in}$, gradually increases to reach a relatively high voltage level $V_H$ of the input signal $S_{in}$, at time t2, the buffering circuit 100 enters the second phase P2. According to some embodiments, the low voltage level $V_L$ is greater than the ground voltage level $V_{GND}$ and smaller than the middle voltage level $V_M$. The high voltage level $V_H$ is smaller than the supply voltage level $V_{DD}$ and greater than the middle voltage level $V_M$.

The controlling circuit 104 is coupled to the buffering circuit 102 for, i.e. during the second phase P2, generating a first control signal $S_P$ to disconnect the buffering circuit 102 from the supply voltage source and generating a second control signal $S_n$ to connect the buffering circuit 102 to the ground voltage source when the buffering circuit 102 transits the output signal $S_o$ from the supply voltage level $V_{DD}$ to the ground voltage level $V_{GND}$. The controlling circuit 104 further, i.e. during the first phase P1, generates the first control signal $S_P$ to connect the buffering circuit 102 to the supply voltage source and generates the second control signal $S_n$ to disconnect the buffering circuit 102 from the ground voltage source when the buffering circuit 102 transits the output signal $S_o$ from the ground voltage level $V_{GND}$ to the supply voltage level $V_{DD}$, i.e. the first phase P1.

The detecting circuit 106 is coupled to the buffering circuit 102 and the controlling circuit 104 for generating a first detect signal $S_{d1}$ and a second detect signal $S_{d2}$ to the controlling circuit 104 by detecting the high voltage level $V_H$ and the low voltage level $V_L$ of the input signal $S_{in}$. The controlling circuit 104 generates the first control signal $S_P$ and the second control signal $S_n$ according to the first detect signal $S_{d1}$ and the second detect signal $S_{d2}$. The controlling circuit 104 further generates a third control signal EN according to the first detect signal $S_{d1}$ and the second detect signal $S_{d2}$.

Figure 3:
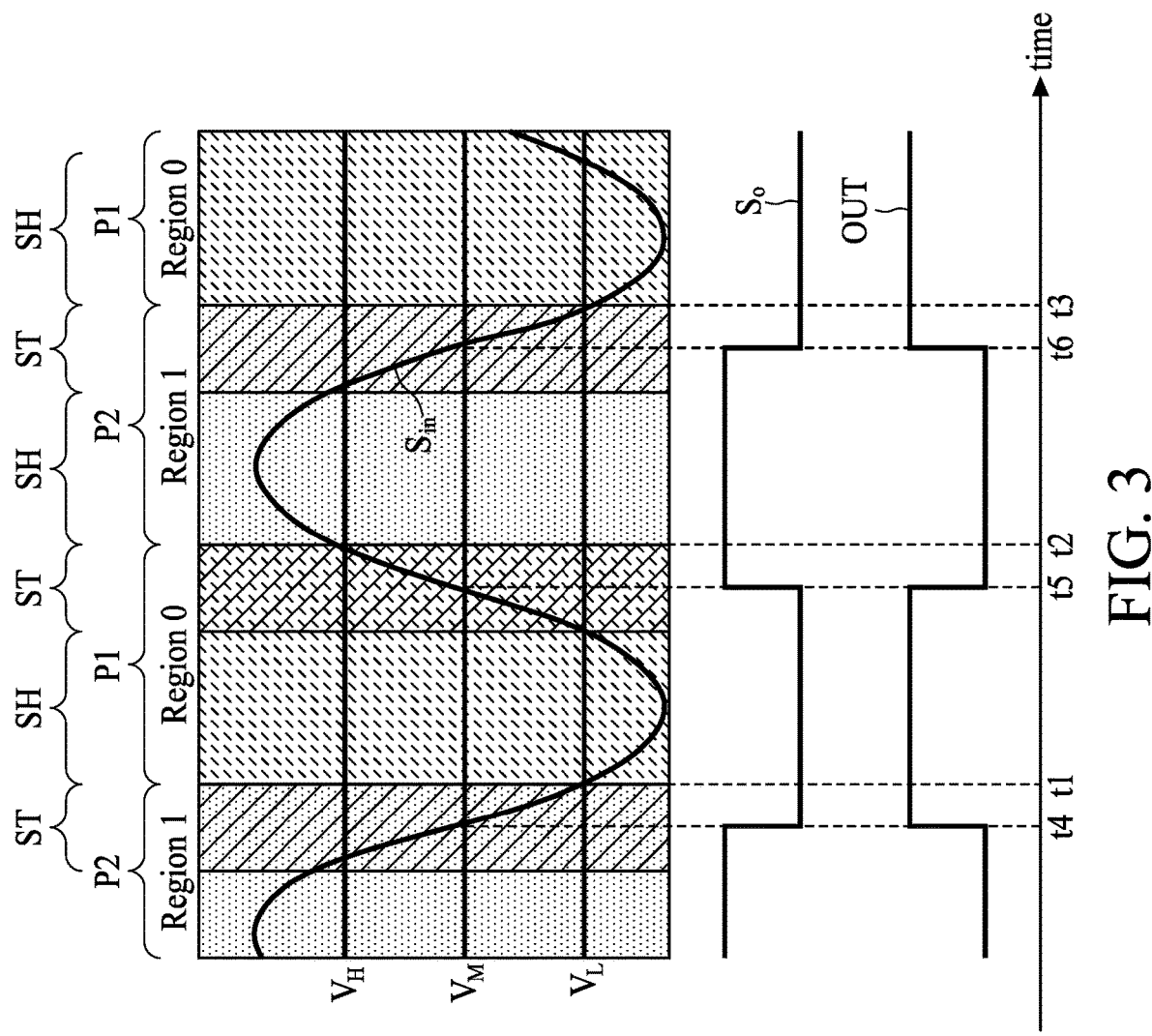
FIG. 3 is a timing diagram illustrating an input signal, an output signal, and a clock signal of a buffering circuit in accordance with some embodiments.

The regenerative circuit 108 is coupled to the buffering circuit 102 and the controlling circuit 104 for generating a clock signal OUT according to the third control signal EN and the output signal $S_o$. FIG. 3 is a timing diagram illustrating the input signal $S_{in}$, the output signal $S_o$, and the clock signal OUT of the buffering circuit 102 in accordance with some embodiments. According to some embodiments, the regenerative circuit 108 is configured to be a latching circuit during the sections SH of the input signal $S_{in}$, and the regenerative circuit 108 is configured to be an inverter during the sections ST of the input signal $S_{in}$. The section ST (i.e. sec. T) is the region when the voltage level of the input signal $S_{in}$ is greater than the low voltage level $V_L$ and smaller than the high voltage level $V_H$. The section SH (i.e. sec. H) is the region when the voltage level of the input signal $S_{in}$, is greater than the high voltage level $V_H$ or the region when the voltage level of the input signal $S_{in}$ is smaller than the low voltage level $V_L$.

When the regenerative circuit 108 is configured as a latching circuit, the regenerative circuit 108 hold/latch the instant voltage level of the clock signal OUT at times t1, t2, and t3, for example. When the regenerative circuit 108 is configured as an inverter, at the moments the buffering circuit 102 transiting the output signal $S_o$ from the supply voltage level $V_{DD}$ to the ground voltage level $V_{GND}$ and transiting the output signal $S_o$ from the ground voltage level $V_{GND}$ to the supply voltage level $V_{DD}$, the regenerative circuit 108 inverts the voltage level of the output signal $S_o$.

For example, at time t4 in the section ST, the regenerative circuit 108 is configured as an inverter, and the regenerative circuit 108 transits the voltage level of the clock signal OUT to the logic-high voltage level from the logic-low voltage level when the voltage level of the output signal $S_o$ is transited to the logic-low voltage level from the logic-high voltage level. At time t1 entering the section SH, the regenerative circuit 108 is configured as a latching circuit, and the regenerative circuit 108 holds/latches the logic-high voltage level of the clock signal OUT during the section SH. At time t5 in the section ST, the regenerative circuit 108 is configured as an inverter, and the regenerative circuit 108 transits the voltage level of the clock signal OUT to the logic-low voltage level from the logic-high voltage level when the voltage level of the $S_o$ is transited to the logic-high voltage level from the logic-low voltage level. At time t2 entering the section SH, the regenerative circuit 108 is configured as a latching circuit, and the regenerative circuit 108 holds/latches the logic-low voltage level of the clock signal OUT during the section SH.

Figures 4A, 4B:
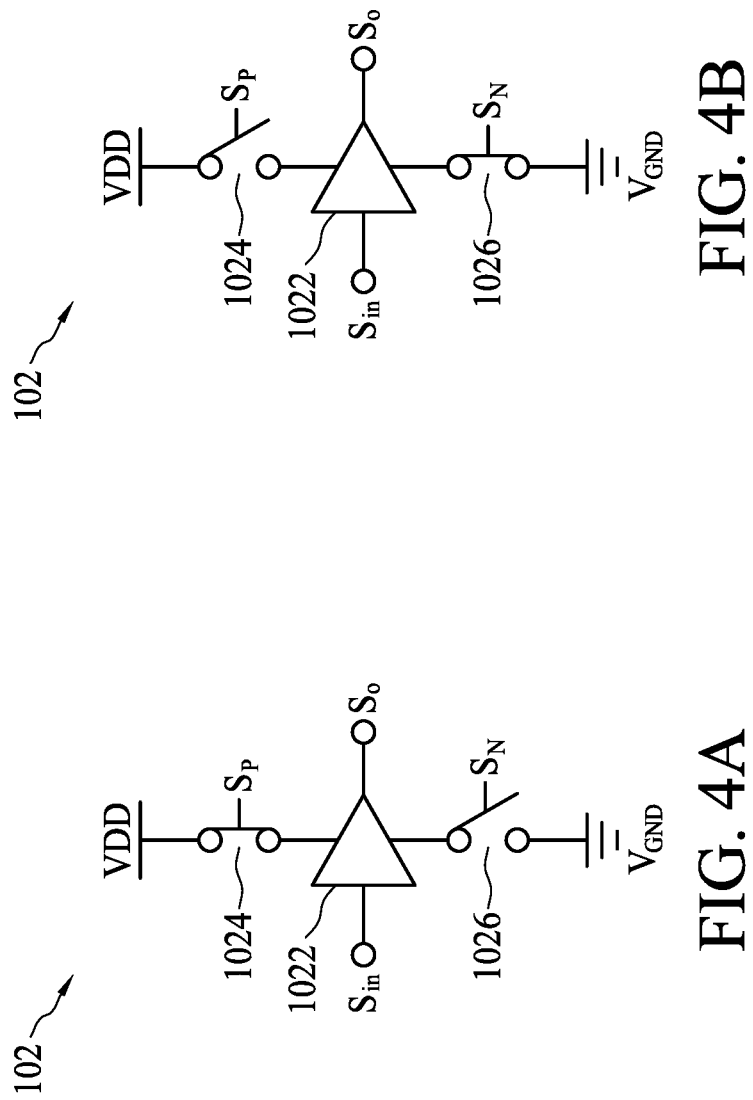
FIG. 4A is a diagram illustrating a buffering circuit operated under a first phase of an input signal in accordance with some embodiments.
FIG. 4B is a diagram illustrating a buffering circuit operated under a second phase of an input signal in accordance with some embodiments.

FIG. 4A is a diagram illustrating the buffering circuit 102 operated under the first phase P1 of the input signal $S_{in}$ in accordance with some embodiments. According to some embodiments, the buffering circuit 102 comprises a buffer 1022, a first switch 1024, and a second switch 1026. The buffer 1022 has an output terminal outputting the output signal $S_o$ according to the input signal $S_{in}$. The first switch 1024 has a first terminal coupled to the output terminal, a second terminal receiving the supply voltage level $V_{DD}$ of the supply voltage source, and a control terminal receiving the first control signal $S_P$. The second switch 1026 has a first terminal coupled to the output terminal outputting the output signal $S_o$, a second terminal receiving the ground voltage level $V_{GND}$ of the ground voltage source, and a control terminal receiving the second control signal $S_N$. During the first phase P1, the first switch 1024 is turned on by the first control signal $S_P$, and the second switch 1026 is turned off by the second control signal $S_N$. When the first switch 1024 is turned on and the second switch 1026 is turned off, the voltage level of the output signal $S_o$ may not transit to the ground voltage level $V_{GND}$ once the voltage level of the output signal $S_o$ is transited to the supply voltage level $V_{DD}$.

FIG. 4B is a diagram illustrating the buffering circuit 102 operated under the second phase P2 of the input signal $S_{in}$ in accordance with some embodiments. During the second phase P2, the first switch 1024 is turned off by the first control signal $S_P$, and the second switch 1026 is turned on by the second control signal $S_N$. When the first switch 1024 is turned off and the second switch 1026 is turned on, the voltage level of the output signal $S_o$ may not transit to the supply voltage level $V_{DD}$ once the voltage level of the output signal $S_o$ is transited to the ground voltage level $V_{GND}$.

Figure 5:
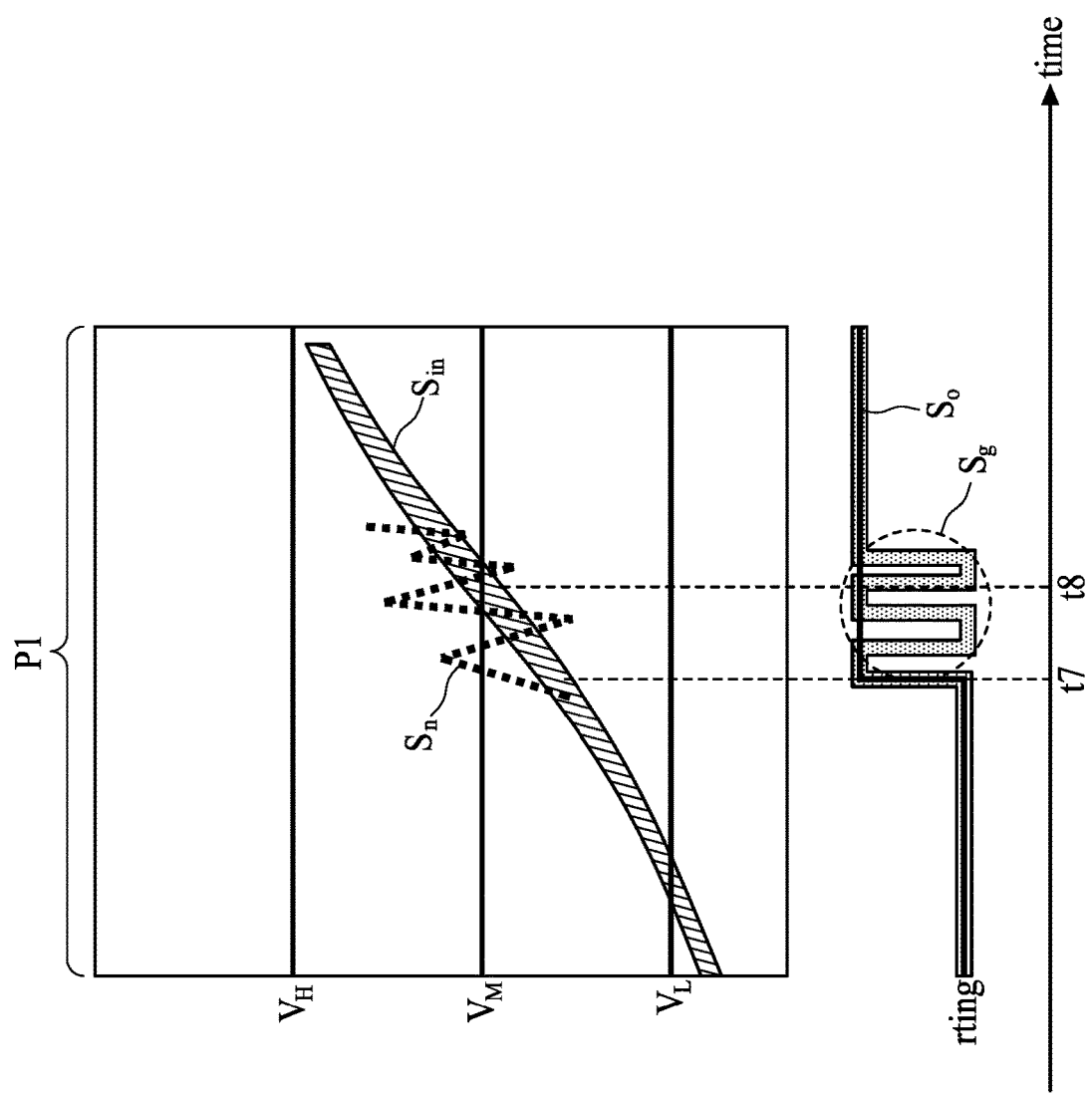
FIG. 5 is a timing diagram illustrating an input signal and an output signal during a first phase in accordance with some embodiments.

FIG. 5 is a timing diagram illustrating the input signal $S_{in}$ and the output signal $S_o$ during the first phase P1 in accordance with some embodiments. According to this embodiment, during the first phase P1, the voltage level of the input signal $S_{in}$ gradually increases from the minimum voltage level to approach the middle voltage level $V_M$. However, a noise signal $S_{in}$ may cause the voltage level of the input signal $S_{in}$ to reach the middle voltage level $V_M$ at time t7 rather than time t8. At time t7, the voltage level of the output signal $S_o$ is transited to the supply voltage level $V_{DD}$. The noise signal $S_{in}$ may cause the voltage level of the input signal $S_{in}$ to vibrate around the middle voltage level $V_M$. In the related art, the vibration may cause glitches $S_g$ or jitter in the output signal $S_o$. However, as mentioned above, when the second switch 1026 is turned off during the first phase P1, the voltage level of the output signal $S_o$ may not transit to the ground voltage level $V_{GND}$ even when the voltage level of the input signal $S_{in}$ is lower than the middle voltage level $V_M$. Therefore, by turning off the second switch 1026, the voltage level of the output signal $S_o$ may be kept on the supply voltage level $V_{DD}$ when the voltage level of the input signal $S_{in}$ vibrates around the middle voltage level $V_M$. Accordingly, the glitches $S_g$ or jitter may be eliminated from the output signal $S_o$.

On the other hand, during the first phase P1, when the voltage level of the input signal $S_{in}$, gradually decreases from the maximum voltage level to cross the middle voltage level $V_M$, the vibration caused by the noise signal may not generate the glitches or jitter on the output signal $S_o$. The reason is similar to the description of FIG. 5, and the detailed description is omitted here for brevity.

Figure 6B:
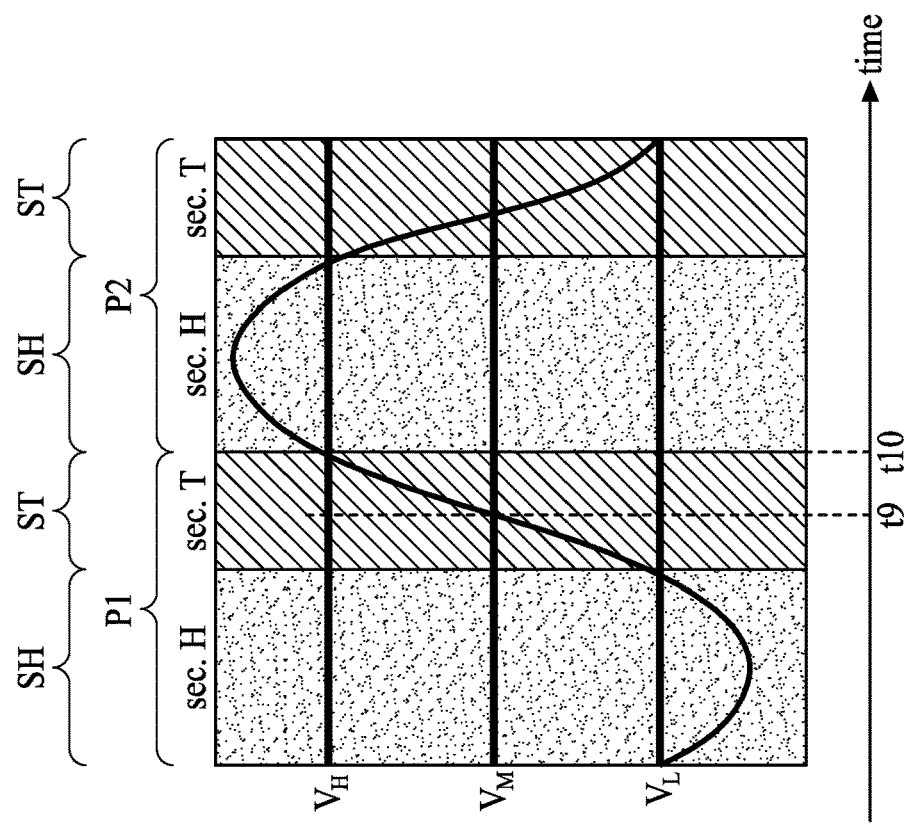
FIG. 6B is a timing diagram illustrating a first phase and a second phase of an input signal in accordance with some embodiments.
Figure 6A:
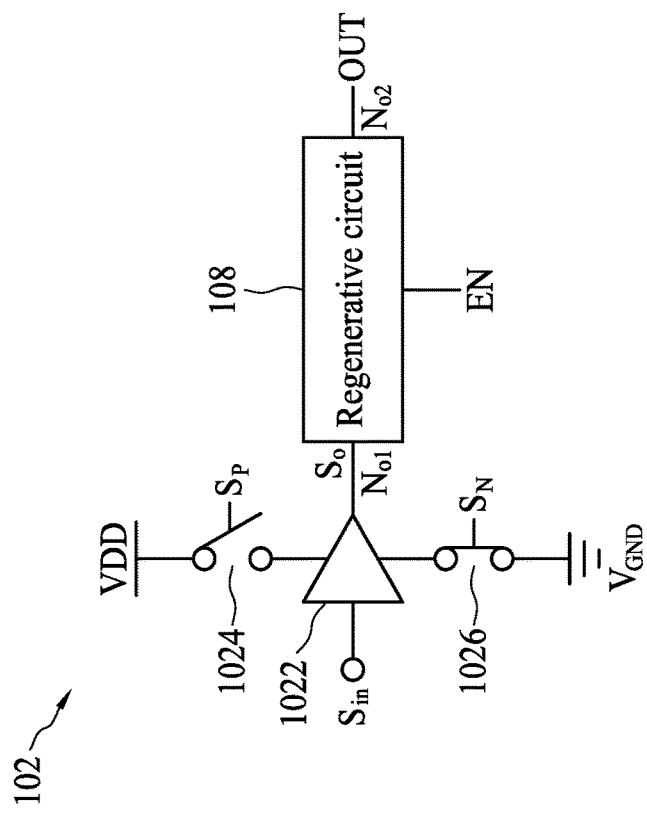
FIG. 6A is a diagram illustrating a buffering circuit and a regenerative circuit during a section in a second phase in accordance with some embodiments.

FIG. 6A is a diagram illustrating the buffering circuit 102 and the regenerative circuit 108 during the section SH in the second phase P2 in accordance with some embodiments. FIG. 6B is a timing diagram illustrating the first phase P1 and the second phase P2 of the input signal $S_{in}$ in accordance with some embodiments. As mentioned in FIG. 4A, during the section ST in the first phase P1, the first switch 1024 is turned on and the second switch 1026 is turned off, and the regenerative circuit 108 is configured to be an inverter. During the section ST in the first phase P1, the voltage level of the output signal $S_o$ is transited to the supply voltage level $V_{DD}$ from the ground voltage level $V_{GND}$ at time t9.

Then, as mentioned in FIG. 4B, at time t10, the buffering device 100 enters the second phase P2. During the section SH in the second phase P2, the first switch 1024 is turned off and the second switch 1026 is turned on. When the first switch 1024 is turned off, the connecting path between the supply voltage source and the buffer 1022 is opened, and the voltage level of the output signal $S_o$ (i.e. the supply voltage level $V_{DD}$) on the output terminal $N_o$ may be floating. When the voltage level on the output terminal $N_{o1}$ is floating, the voltage level on the output terminal $N_{o1}$ is relatively unstable, which may affect the driving capability of the output signal $S_o$. To solve this problem, the regenerative circuit 108 is configured to be a latching circuit to latch/hold the voltage level of the output terminal $N_{o1}$ on the supply voltage level $V_{DD}$ during the section SH in the second phase P2 (as well as the section SH in the first phase Pt). In this embodiment, during the section SH in the second phase P2, when the voltage level on the output terminal $N_{o1}$ is held/latched on the supply voltage level $V_{DD}$, the voltage level on the output terminal $N_{o2}$ of the regenerative circuit 108 may be held/latched on the ground voltage level $V_{GND}$ to provide a solid logic low level.

Similarly, during the section SH in the first phase P1, when the first switch 1024 is turned on and the second switch 1026 is turned off, the regenerative circuit 108 is configured to be a latching circuit to latch/hold the voltage level of the output terminal $N_{o1}$ on the ground voltage level $V_{GND}$. When the voltage level on the output terminal $N_{o1}$ is held/latched on the ground voltage level $V_{GND}$, the voltage level on the output terminal $N_{o2}$ of the regenerative circuit 108 may be held/latched on the supply voltage level $V_{DD}$ to provide a solid logic high. The detailed description is omitted here for brevity.

Figure 7:
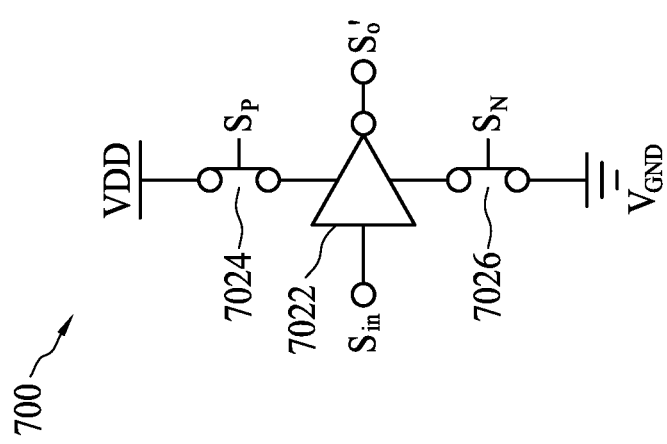
FIG. 7 is a diagram illustrating a buffering circuit in accordance with some embodiments.

In FIG. 4A and FIG. 4B, the buffering circuit 102 is a voltage buffer. However, this is a limitation of the present embodiments. In another embodiment, the buffering circuit 102 may be an inverting circuit for inverting the voltage level of the input signal $S_{in}$. FIG. 7 is a diagram illustrating a buffering circuit 700 in accordance with some embodiments. The buffering circuit 700 comprises an inverter 7022, a first switch 7024, and a second switch 7026. The inverter 7022 has an output terminal outputting the output signal $S_o$ according to the input signal $S_{in}$. The first switch 7024 has a first terminal coupled to the output terminal, a second terminal receiving the supply voltage level $V_{DD}$ of the supply voltage source, and a control terminal receiving the first control signal $S_P$. The second switch 7026 has a first terminal coupled to the output terminal outputting the output signal $S_o'$, a second terminal receiving the ground voltage level $V_{GND}$ of the ground voltage source, and a control terminal receiving the second control signal $S_N$. According to some embodiments, when the voltage level of the input signal $S_{in}$ is greater than the middle voltage level $V_M$, the inverter 7022 of the buffering circuit 700 outputs the ground voltage level $V_{GND}$, and when the voltage level of the input signal $S_{in}$ is smaller than the middle voltage level $V_M$, the inverter 7022 of the buffering circuit 700 outputs the supply voltage level $V_{DD}$.

Figures 8A, 8B:
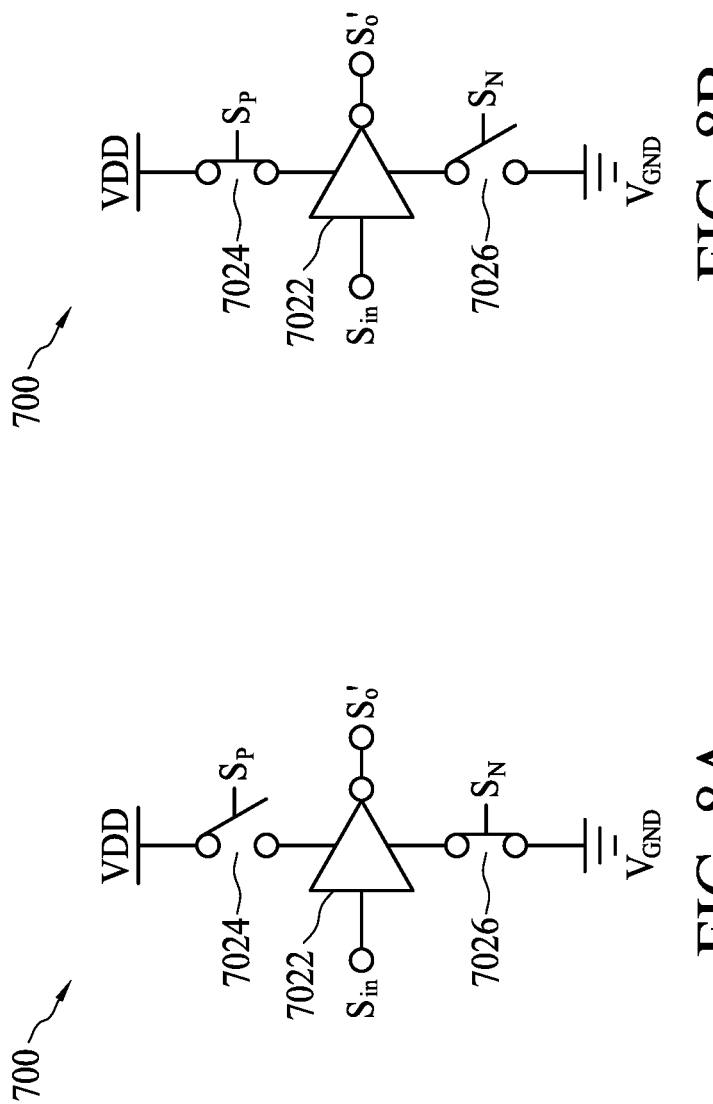
FIG. 8A is a diagram illustrating a buffering circuit operated under a first phase of an input signal in accordance with some embodiments.
FIG. 8B is a diagram illustrating a buffering circuit operated under a second phase of an input signal in accordance with some embodiments.

FIG. 8A is a diagram illustrating the buffering circuit 700 operated under the first phase P1 of the input signal $S_{in}$ in accordance with some embodiments. During the first phase P1, the first switch 7024 is turned off by the first control signal $S_P$, and the second switch 7026 is turned on by the second control signal $S_N$. When the first switch 7024 is turned off and the second switch 7026 is turned on, the voltage level of the output signal $S_o$ may not transit to the supply voltage level $V_{DD}$ once the voltage level of the output signal $S_o$ is transited to the ground voltage level $V_{GND}$.

FIG. 8B is a diagram illustrating the buffering circuit 700 operated under the second phase P2 of the input signal $S_{in}$ in accordance with some embodiments. During the second phase P2, the first switch 7024 is turned on by the first control signal $S_P$, and the second switch 7026 is turned off by the second control signal $S_N$. When the first switch 7024 is turned on and the second switch 7026 is turned off, the voltage level of the output signal $S_o$ may not transit to the ground voltage level $V_{GND}$ once the voltage level of the output signal $S_o$ is transited to the supply voltage level $V_{DD}$.

Figure 9:
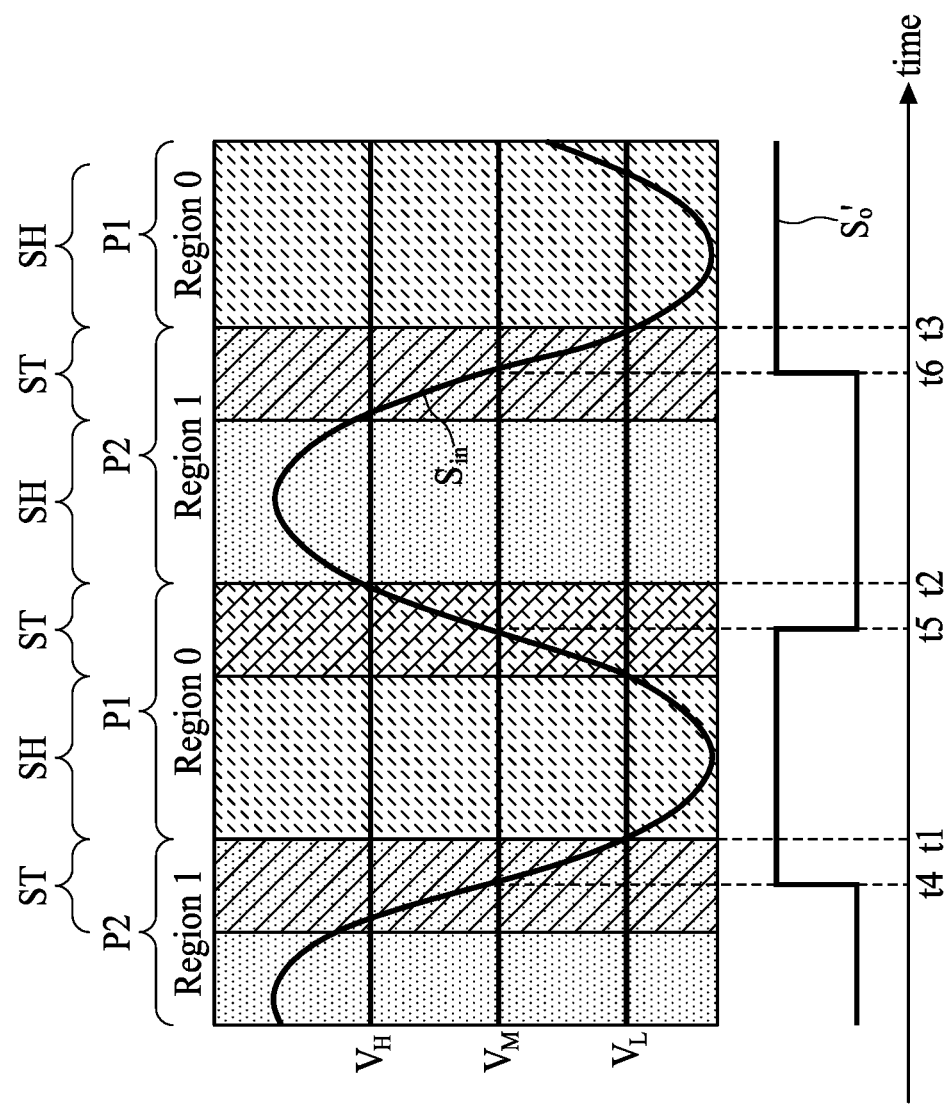
FIG. 9 is a timing diagram illustrating an input signal and an output signal of a buffering circuit in a buffering device in accordance with some embodiments.

According to some embodiments, when the buffering circuit 102 in the buffering device 100 is replaced with the buffering circuit 700, the voltage level of the output signal $S_o$ may be the reversed voltage level of the output signal $S_o$ in FIG. 2. FIG. 9 is a timing diagram illustrating the input signal $S_{in}$ and the output signal $S_o$ of the buffering circuit 700 in the buffering device 100 in accordance with some embodiments. According to some embodiments, when the buffering circuit 700 transits the voltage level of the output signal $S_o$ from the supply voltage level $V_{DD}$ to the ground voltage level $V_{GND}$, the region of the input signal $S_{in}$ is defined as the first phase P1. When the buffering circuit 102 transits the voltage level of the output signal $S_o$ from the ground voltage level $V_{GND}$ to the supply voltage level $V_{DD}$, the region of the input signal $S_{in}$ is defined as the second phase P2. Briefly, during the first phase P1, the voltage level of the input signal $S_{in}$ gradually increases from the minimum voltage level to pass the middle voltage level $V_M$. During the first phase P1, the voltage level of the input signal $S_{in}$ gradually decreases from the maximum voltage level to pass the middle voltage level $V_M$. When the voltage level of the input signal $S_{in}$ gradually decreases to reach a relatively low voltage level $V_L$ of the input signal $S_{in}$ at time t1, the buffering circuit 100 enters the first phase P1. When the voltage level of the input signal $S_{in}$ gradually increases to reach a relatively high voltage level $V_H$ of the input signal $S_{in}$ at time t2, the buffering circuit 100 enters the second phase P2. Furthermore, the section ST is the region when the voltage level of the input signal $S_{in}$ is greater than the low voltage level $V_L$ and smaller than the high voltage level $V_H$. The section ST is the region when the voltage level of the input signal $S_{in}$, is greater than the high voltage level $V_H$ or the region when the voltage level of the input signal $S_{in}$ is smaller than the low voltage level $V_L$. As the buffering circuit 700 may have the similar advantages with the buffering circuit 102, the detailed operation of the buffering circuit 700 is omitted here for brevity.

Figure 10:
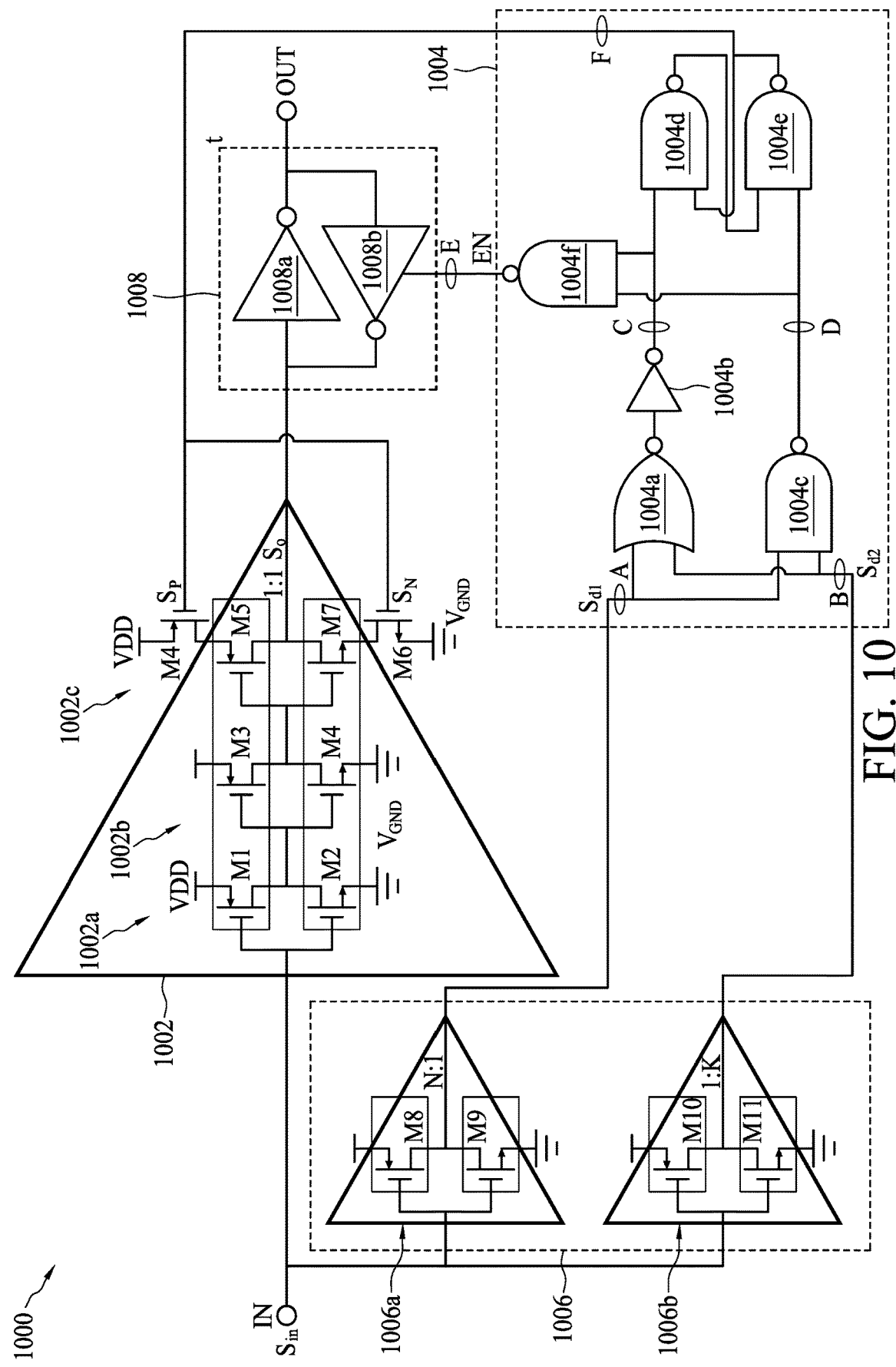
FIG. 10 is a diagram illustrating a buffering device in accordance with some embodiments.

FIG. 10 is a diagram illustrating a buffering device 1000 in accordance with some embodiments. The buffering device 1000 may be an implementation of the buffering device 100. The buffering device 1000 comprises a buffering circuit 1002, a controlling circuit 1004, a detecting circuit 1006, and a regenerative circuit 1008. The connection among the buffering circuit 1002, the controlling circuit 1004, the detecting circuit 1006, and the regenerative circuit 1008 is shown in FIG. 10, and the detailed description is omitted here for brevity. According to some embodiments, the buffering circuit 1002 is arranged to generate the output signal $S_o$ according to the input signal $S_{in}$. The buffering circuit 1002 comprises a first inverter 1002a, a second inverter 1002b, and a third inverter 1002c. The inverters 1002a and 1002b are regular inverter operated between the supply voltage level $V_{DD}$ and the ground voltage level $V_{GND}$. The inverter 1002a is arranged to invert the voltage level of the input signal $S_{in}$, to generate a first inverted signal to the inverter 1002b. The inverter 1002b is arranged to invert the voltage level of the first inverted signal to generate a second inverted signal to the inverter 1002c. The inverter 1002c is arranged to invert the voltage level of the second inverted signal to generate the output signal $S_o$. The inverter 1002a comprises a P-channel transistor (e.g. P-type metal-oxide-semiconductor field-effect transistor, P-type MOSFET) M1 and an N-channel transistor (e.g. N-type metal-oxide-semiconductor field-effect transistor, N-type MOSFET) M2. The driving strength of the P-channel transistor M1 is equal to the driving strength of the N-channel transistor M2. The inverter 1004a comprises a P-channel transistor M3 and an N-channel transistor M4. The driving strength of the P-channel transistor M3 is equal to the driving strength of the N-channel transistor M4. The inverter 1002c comprises two P-channel transistors M4, M5, and two N-channel transistors M6, M7. The P-channel transistor M4 is controlled by the first control signal $S_P$ and is coupled between the P-channel transistor M3 and the supply voltage level $V_{DD}$. The N-channel transistor M6 is controlled by the second control signal $S_N$ and is coupled between the N-channel transistor M7 and the ground voltage level $V_{GND}$. The driving strength of the P-channel transistor M5 is equal to the driving strength of the N-channel transistor M7. In this embodiment, the first control signal $S_P$ and the second control signal $S_N$ may be the same signal.

The detecting circuit 1006 is arranged to generate the first detect signal $S_{d1}$ and the second detect signal $S_{d2}$ by detecting the high voltage level $V_H$ and the low voltage level $V_L$ of the input signal $S_{in}$. The detecting circuit 1006 is operated between the supply voltage level $V_{DD}$ and the ground voltage level $V_{GND}$. The detecting circuit 1006 comprises a first voltage detector 1006a and a second voltage detector 1006b. The first voltage detector 1006a is arranged to generate the first detect signal $S_{d1}$ by detecting the high voltage level $V_H$ of the input signal $S_{in}$. The first voltage detector 1006a is an inverter-based detector comprising a P-channel transistor M8 and an N-channel transistor M9. The first voltage detector 1006a has asymmetric driving strength. The driving strength of the P-channel transistor M8 is greater than the driving strength of the N-channel transistor M9 by N times, wherein N is an integer number greater one. For example, N=5. When the driving strength of the P-channel transistor M8 is greater than the driving strength of the N-channel transistor M9, the voltage level of the first detect signal $S_{d1}$ may change to the ground voltage level $V_{GND}$ when the voltage level of the input signal $S_{in}$ is greater than (i.e. the high voltage level $V_H$) the middle voltage level $V_M$ of the supply voltage level $V_{DD}$ and the ground voltage level $V_{GND}$.

The second voltage detector 1006b is arranged to generate the second detect signal $S_{d2}$ by detecting the low voltage level $V_L$ of the input signal $S_{in}$. The second voltage detector 1006b is an inverter-based detector comprising a P-channel transistor M10 and an N-channel transistor M11. The second voltage detector 1006b has asymmetric driving strength. The driving strength of the N-channel transistor M11 is greater than the driving strength of the P-channel transistor M10 by K times, wherein K is an integer number greater one. For example, K=5. When the driving strength of the N-channel transistor M11 is greater than the driving strength of the P-channel transistor M10, the voltage level of the second detect signal $S_{d2}$ may change to the supply voltage level $V_{DD}$ when the voltage level of the input signal $S_{in}$, is smaller than (i.e. the low voltage level $V_L$) the middle voltage level $V_M$ of the supply voltage level $V_{DD}$ and the ground voltage level $V_{GND}$.

According to some embodiments, the number N and K may be adjusted to customize the high voltage level $V_H$ and the low voltage level $V_L$ respectively.

The controlling circuit 1004 is arranged to generate the first control signal $S_P$, the second control signal $S_n$, and the third control signal EN according to the first detect signal $S_{d1}$ and the second detect signal $S_{d2}$. The controlling circuit 1004 comprises a NOR gate 1004a, an inverter 1004b, a first NAND gate 1004c, a second NAND gate 1004d, a third NAND gate 1004e, and a fourth NAND gate 1004f. The NOR gate 1004a has a first input terminal (i.e. the node A) receiving the first detect signal $S_{d1}$ and a second input terminal (i.e. the node B) receiving the second detect signal $S_{d2}$. The inverter 1004b has an input terminal coupled to an output terminal of the NOR gate 1004a. The first NAND gate 1004c has a first input terminal receiving the first detect signal $S_{d1}$ and a second input terminal receiving the second detect signal $S_{d2}$. The second NAND gate 1004d has a first input terminal (i.e. the node C) coupled to an output terminal of the inverter 1004b. The third NAND gate 1004e has a first input terminal coupled to an output terminal of the second NAND gate 1004d, a second input terminal (i.e. the node D) coupled to an output terminal of the first NAND gate 1004c, and an output terminal (i.e. the node F) coupled to a second input terminal of the second NAND gate 1004d for generating the first control signal $S_P$ as well as the second control signal $S_N$. The fourth NAND gate 1004f has a first input terminal coupled to the output terminal of the first NAND gate 1004c, a second input terminal coupled to the output terminal of the inverter 1004b, and an output terminal (i.e. the node E) outputting the third control signal EN.

The regenerative circuit 1008 is arranged to generate the clock signal OUT according to the third control signal EN and the output signal $S_o$. During the sections SH of the first phase P1 and the second phase P2, the regenerative circuit 1008 is arranged to latch the voltage level of the clock signal OUT into the supply voltage level $V_{DD}$ or the ground voltage level $V_{GND}$ based on the voltage level of the output signal $S_o$. The regenerative circuit 1008 comprises a first inverter 1008a and a second inverter 1008b. The first inverter 1008a has an input terminal receiving the output signal $S_o$, and an output terminal outputting the clock signal OUT. The second inverter 1008b has an input terminal coupled to the output terminal of the first inverter 1008a, an output terminal coupled the input terminal of the first inverter 1008a, and a control terminal receiving the third control signal EN.

The following Table 1 is a truth table illustrating the voltage levels on the nodes A, B, C, D, E, F during the sections SH and sections ST in the first phase P1 and the second phase P2 in accordance with some embodiments, in which the digit "1" represents the supply voltage level $V_{DD}$ and the digit "0" represents the ground voltage level $V_{GND}$.

TABLE 1

| Node | Phase 1 | | Phase 2 | |
| --- | --- | --- | --- | --- |
| | Section SH | Section ST | Section SH | Section ST |
| A | 1 | 1 | 0 | 1 |
| B | 1 | 0 | 0 | 0 |
| C | 1 | 1 | 0 | 1 |
| D | 0 | 1 | 1 | 1 |
| E | 1 | 0 | 1 | 0 |
| F | 1 | 1 | 0 | 0 |

According to Table 1, when the digit on the node E is "1", i.e. when the voltage level of the third control signal EN is the supply voltage level $V_{DD}$, during the sections SH in the phase 1 and the phase 2, the inverter 1008b is enabled, and the inverter 1008a and the inverter 1008b are configured to be a latching circuit. When the digit on the node E is "0", i.e. when the voltage level of the third control signal EN is the ground voltage level $V_{GND}$, during the sections ST in the phase 1 and the phase 2, the inverter 1008b is disabled, and the inverter 1008a is arranged to invert the voltage level of the output signal $S_o$. In addition, when the digit on the node F is "1", i.e. when the voltage level of the first control signal $S_P$ as well as the second control signal $S_N$ is the supply voltage level $V_{DD}$, during the phase 1, the P-channel transistor M4 is turned off and the N-channel transistor M6 is turned on. When the digit on the node F is "0", i.e. when the voltage level of the first control signal $S_P$ as well as the second control signal $S_N$ is the ground voltage level $V_{GND}$, during the phase 2, the P-channel transistor M4 is turned on and the N-channel transistor M6 is turned off.

Figure 11:
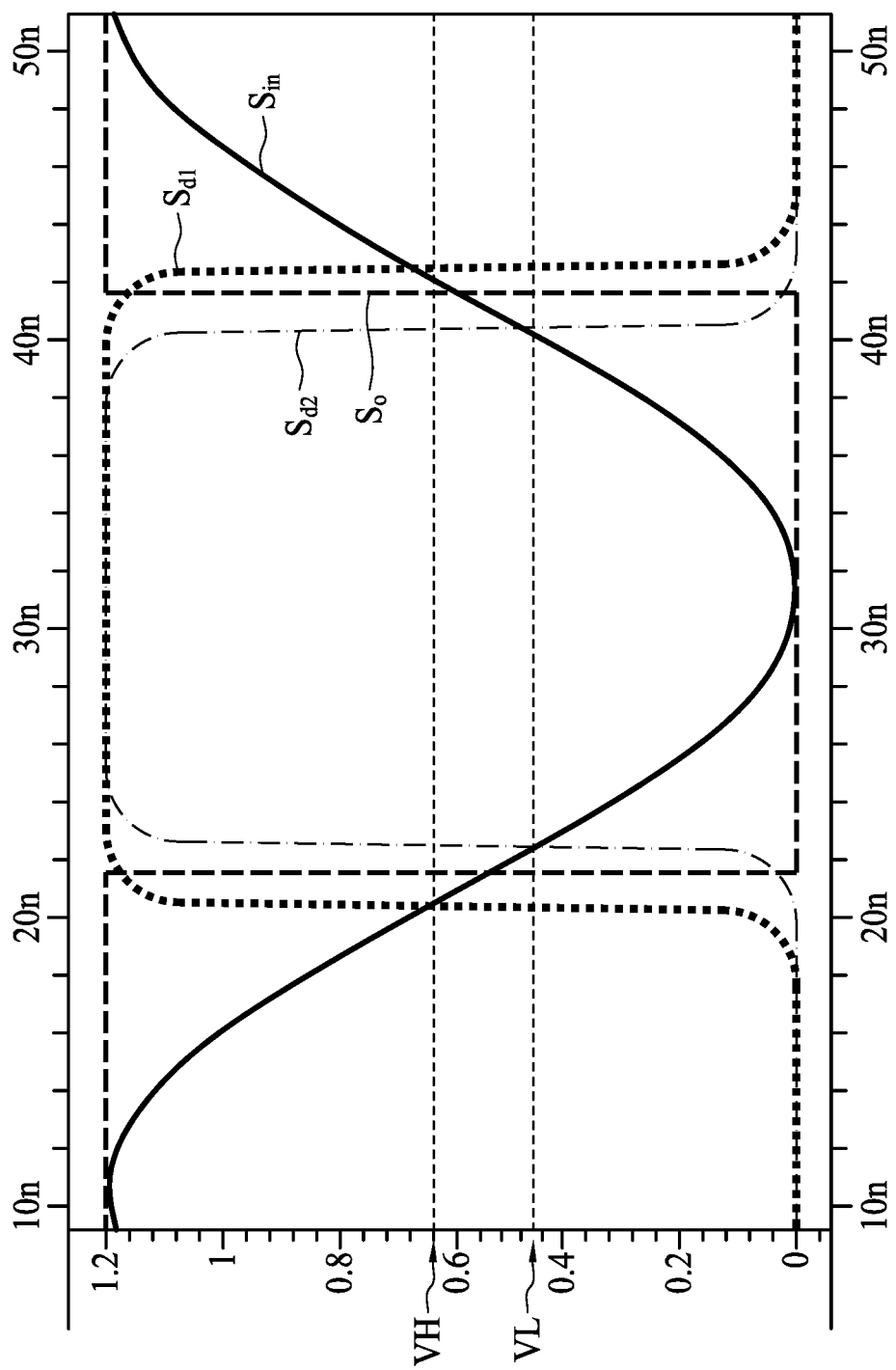
FIG. 11 is a timing diagram illustrating a first detect signal, a second detect signal, an input signal, and an output signal of a buffering device in accordance with some embodiments.

FIG. 11 is a timing diagram illustrating the first detect signal $S_{d1}$, the second detect signal $S_{d2}$, the input signal $S_{in}$, and the output signal $S_o$ of the buffering device 1000 in accordance with some embodiments. It can be seen that the voltage level of the first detect signal $S_{d1}$ transits to the logic-high voltage level (e.g. 1.2V) from the logic-low voltage level (e.g. 0V) when the voltage level of the input signal $S_{in}$ reaches the high voltage level $V_H$ (e.g. 639 mV). The voltage level of the second detect signal $S_{d2}$ transits to the logic-high voltage level (e.g. 1.2V) from the logic-low voltage level (e.g. 0V) when the voltage level of the input signal $S_{in}$ reaches the low voltage level $V_L$ (e.g. 456 mV). The voltage level of the output signal $S_o$ transits to the logic-low voltage level (e.g. 0V) from the logic-high voltage level (e.g. 1.2V) when the voltage level of the input signal $S_{in}$ reaches the middle voltage level $V_M$ (e.g. a voltage level between 456 mV and 639 mV). In this embodiment, the voltage different between the high voltage level $V_H$ and the low voltage level $V_L$ is 183 mV.

Figure 12:
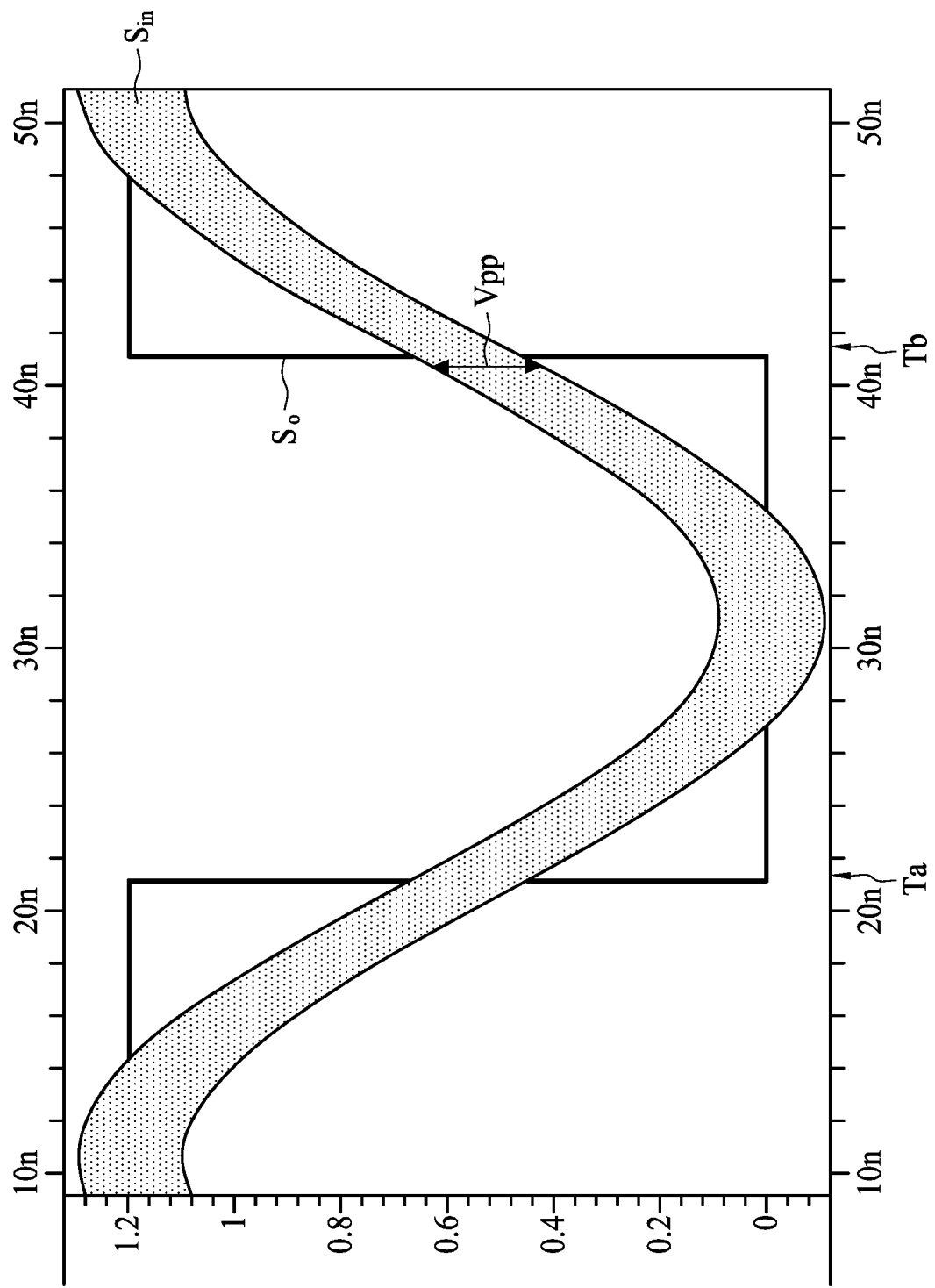
FIG. 12 is a timing diagram illustrating an input signal and an output signal of a buffering device in accordance with some embodiments.

FIG. 12 is a timing diagram illustrating the input signal $S_{in}$ and the output signal $S_o$ of the buffering device 1000 in accordance with some embodiments. In this embodiment, the input signal $S_{in}$ is arranged to have a high frequency noise with a voltage variation of Vpp (i.e. the peak-to-peak voltage of the high frequency noise on the input signal $S_{in}$). As shown in FIG. 12, the voltage level of the output signal $S_o$ transits to the logic-low voltage level (e.g. 0V) from the logic-high voltage level (e.g. 1.2V) at a time Ta, and the voltage level of the output signal $S_o$ transits to the logic-high voltage level (e.g. 1.2V) from the logic-low voltage level (e.g. 0V) at a time Tb even the input signal $S_{in}$ has high frequency noise with the voltage variation of Vpp (e.g. 180 mV). Accordingly, the buffering device 1000 may withstand a high frequency noise with a peak-to-peak voltage of 180 mV without generating any glitch or phase noise on the output signal $S_0$.

Figure 13:
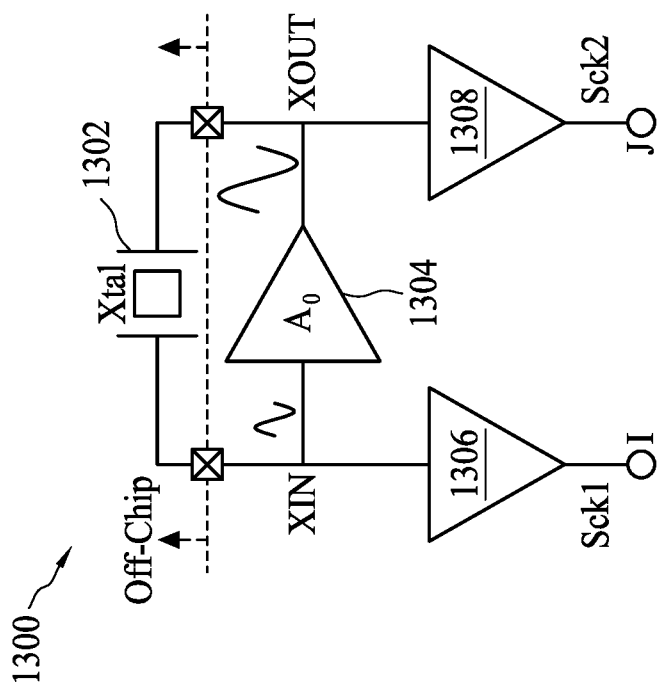
FIG. 13 is a diagram illustrating an oscillating circuit in accordance with some embodiments.

FIG. 13 is a diagram illustrating an oscillating circuit 1300 in accordance with some embodiments. The oscillating circuit 1300 comprises a crystal oscillator 1302, an amplifier 1304, a first buffering device 1306, and a second buffering device 1308. The amplifier 1304 has an input terminal XIN and an output terminal XOUT coupled to a first end and a second end of the crystal oscillator 1302 respectively. The crystal oscillator 1302 and the amplifier 1304 are configured to be an oscillator to generate an oscillating signal, in which the signal swing of the oscillating signal on the input terminal XIN is smaller than the signal swing on the output terminal XOUT. The first buffering device 1306 and/or the second buffering device 1308 may be implemented by the above mentioned buffering devices 100 or 1000. The first buffering device 1306 is arranged to generate a first clock signal Sck1 on the output node I according to the oscillating signal on the input terminal XIN. The second buffering device 1308 is arranged to generate a second clock signal Sck2 on the output node J according to the oscillating signal on the output terminal XOUT. By using the first buffering device 1306 and the second buffering device 1108, the glitches or jitter may be eliminated from the first clock signal Sck1 and the second clock signal Sck2. Accordingly, the first clock signal Sck1 and the second clock signal Sck2 may have a lower phase noise in comparison to the related art that using Schmitts Trigger. For example, the phase noises of the first clock signal Sck1 and the second clock signal Sck2 of the oscillating circuit 1300 are −122.9 dBc/Hz and −124.1 dBc/Hz respectively. When the first buffering device 1306 and the second buffering device 1308 of the oscillating circuit 1300 are replaced with two Schmitts Triggers, the phase noises of the first clock signal Sck1 and the second clock signal Sck2 of the oscillating circuit (i.e. the related art) become −113.4 dBc/Hz and −120.9 dBc/Hz respectively. Accordingly, by using the second buffering device 1308, even the worst phase noise of the proposed buffering device (i.e. the second buffering device 1308) has 3.2 dBc/Hz of phase noise better than the prior art using the Schmitts Trigger when the signal comes from the output terminal XOUT. In addition, by using the first buffering device 1306, a 9.5 dBc/Hz of phase noise improvement may be achieved when the signal comes from the input terminal XIN. It is noted that the reason has been described in above paragraphs, the detailed description is omitted here for brevity.

Figure 14:
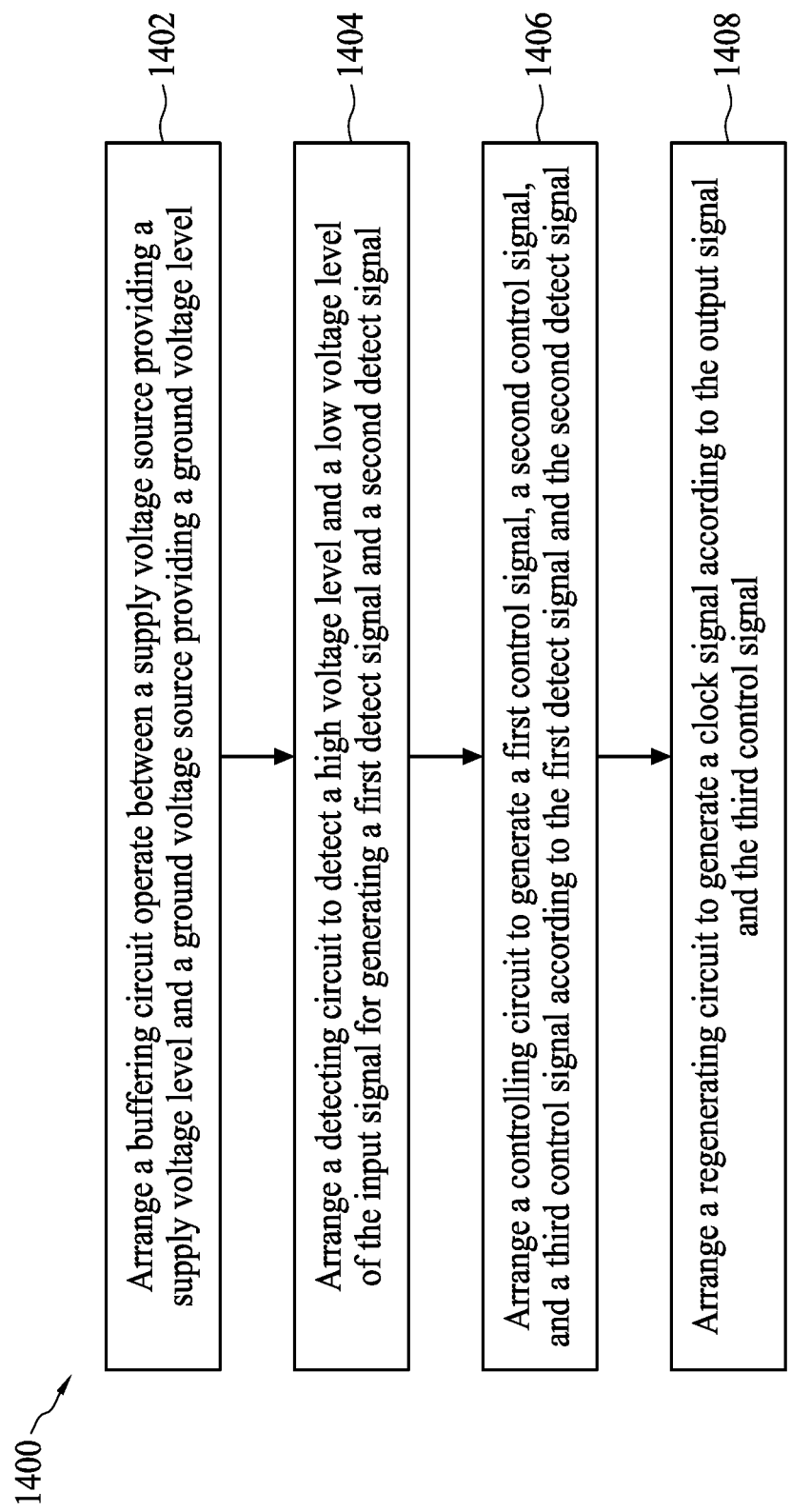
FIG. 14 is a flowchart of a method for controlling a buffering device in accordance with some embodiments.

According to some embodiments, the operation of the buffering device 100 or the buffering device 1000 may be summarized into the operations in FIG. 14. FIG. 14 is a flowchart of a method 1400 for controlling a buffering device in accordance with some embodiments. The buffering device may be the buffering device 100 or the buffering device 1000. The method 1400 comprises operations 1402-1408. In operation 1402, the buffering circuit is arranged to operate between the supply voltage source providing the supply voltage level $V_{DD}$ and the ground voltage source providing the ground voltage level $V_{GND}$. The buffering circuit is arranged to selectively output the output signal $S_o$ with the supply voltage level $V_{DD}$ or the ground voltage level $V_{GND}$ according to the input signal $S_{in}$.

In operation 1404, a detecting circuit is arranged to detect the high voltage level $V_H$ and the low voltage level $V_L$ of the input signal $S_{in}$ for generating the first detect signal $S_{d1}$ and the second detect signal $S_{d2}$. When the voltage level of the input signal $S_{in}$ reaches the high voltage level $V_H$, the detecting circuit generates the first detect signal $S_{d1}$ which the supply voltage level $V_{DD}$. When the voltage level of the input signal $S_{in}$ reaches the low voltage level $V_L$, the detecting circuit generates the second detect signal $S_{d1}$ which the ground voltage level $V_{GND}$.

In operation 1406, a controlling circuit is arranged to generate the first control signal $S_P$, the second control signal $S_N$, and the third control signal EN according to the first detect signal $S_{d1}$ and the second detect signal $S_{d2}$. The first control signal $S_P$ is arranged to disconnect the buffering circuit from the supply voltage source and the second control signal $S_N$ is arranged to connect the buffering circuit to the ground voltage source when the buffering circuit transits the output signal $S_o$ from the supply voltage level $V_{DD}$ to the ground voltage level $V_{GND}$. The first control signal $S_P$ is further arranged to connect the buffering circuit to the supply voltage source and the second control signal $S_N$ is further arranged to disconnect the buffering circuit to the ground voltage source when the buffering circuit transits the output signal $S_o$ from the ground voltage level $V_{GND}$ to the supply voltage level $V_{DD}$.

In operation 1408, a regenerating circuit is arranged to generate the clock signal OUT according to the output signal $S_o$ and the third control signal EN. During the section SH in the first phase P1 and the second phase P2, the regenerating circuit is configured to be a latching circuit to latch the voltage level of the output signal $S_o$. During the section ST in the first phase P1 and the second phase P2, the regenerating circuit is configured to be an inverter to invert the voltage level of the output signal $S_o$.

Briefly, according to the embodiments, when the voltage level of the output signal $S_o$ is to be changing to the supply voltage level $V_{DD}$ from the ground voltage level $V_{GND}$, the connection between the buffering circuit 102 and the supply voltage source is closed and the connection between the buffering circuit 102 and the ground voltage source is opened. When the voltage level of the output signal $S_o$ is to be changing to the ground voltage level $V_{GND}$ from the supply voltage level $V_{DD}$, the connection between the buffering circuit 102 and the supply voltage source is opened and the connection between the buffering circuit 102 and the ground voltage source is closed. Accordingly, the voltage level of the output signal $S_o$ may be kept on the supply voltage level $V_{DD}$ or the ground voltage level $V_{GND}$ after the voltage transition, and the glitches $S_g$ or jitter may be eliminated from the output signal $S_o$.

In some embodiments, the present disclosure provides a buffering device. The buffering device comprises a buffering circuit and a controlling circuit. The buffering circuit is coupled between a first voltage source providing a first voltage level and a second voltage source providing a second voltage level, for selectively outputting an output signal with the first voltage level or the second voltage level according to an input signal. The controlling circuit is coupled to the buffering circuit, for generating a first control signal to disconnect the buffering circuit from the first voltage source and generating a second control signal to connect the buffering circuit to the second voltage source when the buffering circuit transits the output signal from the first voltage level to the second voltage level. The second voltage level is different from the first voltage level.

In some embodiments, the present disclosure provides a buffering device. The buffering device comprises a buffering circuit and a controlling circuit. The buffering circuit is coupled between a first voltage source providing a first voltage level and a second voltage source providing a second voltage level, for transiting a voltage level of an output signal from the first voltage level to the second voltage level during a first phase of an input signal, and transiting the voltage level of the output signal from the second voltage level to the first voltage level during a second phase of the input signal. The controlling circuit is coupled to the buffering circuit, for disconnecting the buffering circuit from the first voltage source and connecting the buffering circuit to the second voltage source during the first phase, and disconnecting the buffering circuit from the second voltage source and connecting the buffering circuit to the first voltage source during the second phase. The first voltage level is different from the second voltage level.

In some embodiments, the present disclosure provides a method of controlling a buffering device. The method comprises: arranging the buffering circuit to couple between a first voltage source providing a first voltage level and a second voltage source providing a second voltage level; arranging the buffering circuit to selectively output an output signal with the first voltage level or the second voltage level according to an input signal; and generating a first control signal to disconnect the buffering circuit from the first voltage source and generating a second control signal to connect the buffering circuit to the second voltage source when the buffering circuit transits the output signal from the first voltage level to the second voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A buffering device, comprising:
a buffering circuit, coupled between a first voltage source providing a first voltage level and a second voltage source providing a second voltage level, for selectively outputting an output signal with the first voltage level or the second voltage level according to an input signal;
a controlling circuit, coupled to the buffering circuit, for generating a first control signal to disconnect the buffering circuit from the first voltage source and generating a second control signal to connect the buffering circuit to the second voltage source when the buffering circuit transits the output signal from the first voltage level to the second voltage level in a transition section, wherein the second voltage level is different from the first voltage level; and
a regenerative circuit configured for generating a clock signal by converting, in the transition section, the output signal and by latching the converted output signal.

2. The buffering device of claim 1, wherein the controlling circuit further generates the first control signal to connect the buffering circuit to the first voltage source and generates the second control signal to disconnect the buffering circuit from the second voltage source when the buffering circuit transits the output signal from the second voltage level to the first voltage level.

3. The buffering device of claim 2, further comprising:
a detecting circuit, coupled to the buffering circuit and the controlling circuit, for generating a first detect signal and a second detect signal to the controlling circuit by detecting a third voltage level and a fourth voltage level of the input signal;
wherein the fourth voltage level is different from the third voltage level, and the controlling circuit generates the first control signal and the second control signal according to the first detect signal and the second detect signal.

4. The buffering device of claim 3, wherein the detecting circuit comprises:
a first voltage detector, arranged to generate the first detect signal with the second voltage level when a voltage level of the input signal reaches the third voltage level; and
a second voltage detector, arranged to generate the second detect signal with the first voltage level when a voltage level of the input signal reaches the fourth voltage level;
wherein the third voltage level is greater than a middle voltage level and smaller than the first voltage level, the fourth voltage level is smaller than the middle voltage level and greater than the second voltage level, and the middle voltage level is an average voltage level of the first voltage level and the second voltage level.

5. The buffering device of claim 4, wherein the first voltage detector comprises:
a P-channel transistor, having a source receiving the first voltage level, a gate receiving the input signal, and a drain outputting the first detect signal; and
an N-channel transistor, having a source receiving the second voltage level, a gate couple to the gate of the P-channel transistor, and a drain coupled to the drain of the P-channel transistor;
wherein the P-channel transistor has a first driving current, the N-channel transistor has a second driving current, and the first driving current is greater than the second driving current.

6. The buffering device of claim 5, wherein the second voltage detector comprises:
a P-channel transistor, having a source receiving the first voltage level, a gate receiving the input signal, and a drain outputting the second detect signal; and
an N-channel transistor, having a source receiving the second voltage level, a gate couple to the gate of the P-channel transistor, and a drain coupled to the drain of the P-channel transistor;
wherein the P-channel transistor has a first driving current, the N-channel transistor has a second driving current, and the first driving current is smaller than the second driving current.

7. The buffering device of claim 3, wherein the controlling circuit comprises:
a NOR gate, having a first input terminal receiving the first detect signal, a second input terminal receiving the second detect signal;
an inverter, having an input terminal coupled to an output terminal of the NOR gate;
a first NAND gate, having a first input terminal receiving the first detect signal, and a second input terminal receiving the second detect signal;
a second NAND gate, having a first input terminal coupled to an output terminal of the inverter;
a third NAND gate, having a first input terminal coupled to an output terminal of the second NAND gate, a second input terminal coupled to an output terminal of the first NAND gate, and an output terminal coupled to a second input terminal of the second NAND gate for generating the first control signal and the second control signal; and
a fourth NAND gate, having a first input terminal coupled to the output terminal of the first NAND gate, a second input terminal coupled to the output terminal of the inverter, and an output terminal outputting the third control signal.

8. The buffering device of claim 2, wherein the controlling circuit further generates a third control signal according to the first detect signal and the second detect signal,
wherein the regenerative circuit is configured for generating the clock signal according to the third control signal and the output signal.

9. The buffering device of claim 8, wherein the third control signal controls the regenerative circuit to latch the first voltage level of the output signal or to latch the second voltage level of the output signal to generate the clock signal.

10. The buffering device of claim 8, wherein the regenerative circuit comprises:
a first inverter, having an input terminal receiving the output signal, and an output terminal outputting the clock signal; and
a second inverter, having an input terminal coupled to the output terminal of the first inverter, an output terminal coupled the input terminal of the first inverter, and a control terminal receiving the third control signal.

11. The buffering device of claim 2, wherein the buffering circuit comprises:
a first inverter, having an output terminal outputting the output signal according to the input signal and;
a first switch, having a first terminal coupled to the output terminal, a second terminal coupled to the first voltage source, and a control terminal receiving the first control signal; and a second switch, having a first terminal coupled to the output terminal and a second terminal coupled to the second voltage source, and a control terminal receiving the second control signal.

12. The buffering device of claim 11, wherein the buffering circuit further comprises:
a second inverter, having an input terminal receiving the input signal and an output terminal coupled to an input terminal of the first inverter for outputting an inverting signal;
wherein the first inverter outputs the output signal according to the inverting signal.

13. A buffering device, comprising:
a buffering circuit, coupled between a first voltage source providing a first voltage level and a second voltage source providing a second voltage level, for transiting a voltage level of an output signal from the first voltage level to the second voltage level during a first phase of an input signal, and transiting the voltage level of the output signal from the second voltage level to the first voltage level during a second phase of the input signal;
a controlling circuit, coupled to the buffering circuit, for disconnecting the buffering circuit from the first voltage source and connecting the buffering circuit to the second voltage source during the first phase, and disconnecting the buffering circuit from the second voltage source and connecting the buffering circuit to the first voltage source during the second phase,
wherein the first voltage level is different from the second voltage level; and
a regenerative circuit, coupled to the buffering circuit and the controlling circuit, wherein the regenerative circuit is configured for generating a clock signal according to the output signal.

14. The buffering device of claim 13, further comprising:
a detecting circuit, coupled to the buffering circuit and the controlling circuit, for detecting a voltage level of an input signal to generate a detect signal to the controlling circuit;
wherein when the detecting circuit detects that the voltage level of the input signal reaches a third voltage level from a middle voltage level, the controlling circuit controls the buffering circuit to enter the first phase according to the detect signal; when the detecting circuit detects that the voltage level of the input signal reaches the fourth voltage level from the middle voltage level, the controlling circuit controls the buffering circuit to enter the second phase according to the detect signal; wherein the third voltage level is greater than the middle voltage level and smaller than the first voltage level, the fourth voltage level is smaller than the middle voltage level and greater than the second voltage level, and the middle voltage level is an average voltage level of the first voltage level and the second voltage level.

15. The buffering device of claim 14, wherein the regenerative circuit comprises:
a latching circuit, coupled to the buffering circuit and the controlling circuit,
wherein the controlling circuit controls the latching circuit to latch the output signal when the voltage level of the input signal is greater than the third voltage level.

16. The buffering device of claim 15, wherein the controlling circuit further controls the latching circuit to latch the output signal when the voltage level of the input signal is smaller than the fourth voltage level.

17. The buffering device of claim 15, wherein the controlling circuit controls the latching circuit to invert the voltage level of the output signal when the voltage level of the input signal is greater than the fourth voltage level and smaller than the third voltage level.

18. A method of controlling a buffering device, the method comprising:
arranging a buffering circuit to couple between a first voltage source providing a first voltage level and a second voltage source providing a second voltage level;
arranging the buffering circuit to selectively output an output signal with the first voltage level or the second voltage level according to an input signal;
generating a first control signal to disconnect the buffering circuit from the first voltage source and generating a second control signal to connect the buffering circuit to the second voltage source when the buffering circuit transits the output signal from the first voltage level to the second voltage level; and
generating a clock signal according to the output signal.

19. The method of claim 18, further comprising:
generating the first control signal to connect the buffering circuit to the first voltage source and generates the second control signal to disconnect the buffering circuit from the second voltage source when the buffering circuit transits the output signal from the second voltage level to the first voltage level.

20. The method of claim 19, further comprising:
generating a first detect signal with the second voltage level when a voltage level of the input signal reaches a third voltage level;
generating a second detect signal with the first voltage level when the voltage level of the input signal reaches a fourth voltage level; and
generating the first control signal and the second control signal according to the first detect signal and the second detect signal;
wherein the third voltage level is greater than a middle voltage level and smaller than the first voltage level, the fourth voltage level is smaller than the middle voltage level and greater than the second voltage level, and the middle voltage level is an average voltage level of the first voltage level and the second voltage level.

* * * * *